(12) United States Patent
Cheng

(10) Patent No.: US 7,628,641 B2
(45) Date of Patent: Dec. 8, 2009

(54) BOARD-TO-BOARD CONNECTOR ASSEMBLY HAVING PULL TAB

(75) Inventor: Yung-Chang Cheng, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/321,267

(22) Filed: Jan. 16, 2009

(65) Prior Publication Data

US 2009/0186496 A1 Jul. 23, 2009

(30) Foreign Application Priority Data

Jan. 17, 2008 (CN) .................... 2008 2 0031302 U

(51) Int. Cl.
*H01R 13/00* (2006.01)
(52) U.S. Cl. ..................................... 439/483
(58) Field of Classification Search ................. 439/483, 439/484, 476.1
See application file for complete search history.

(56) References Cited

U.S. PATENT DOCUMENTS

| 3,430,983 | A | 3/1969 | Jones |
| 3,542,157 | A | 11/1970 | Noah |
| 3,785,517 | A | 1/1974 | Bralkovich |
| 4,437,597 | A | 3/1984 | Doyle |
| 4,932,829 | A | 6/1990 | Miller |
| 6,241,104 | B1 | 6/2001 | Kraus |
| 6,524,056 | B1 | 2/2003 | Kloster |
| 6,634,849 | B2 | 10/2003 | Clary |
| 6,640,979 | B1 | 11/2003 | Mayfield |
| 6,698,994 | B2 | 3/2004 | Barrett |
| 6,755,309 | B1 | 6/2004 | Runge |
| 6,866,282 | B2 | 3/2005 | Heerspink |
| 6,968,986 | B1 | 11/2005 | Lloyd et al. |
| 7,150,359 | B1 | 12/2006 | Lyons et al. |
| 2003/0108411 | A1 | 6/2003 | Shirvell |
| 2004/0262347 | A1 | 12/2004 | Green |
| 2005/0111945 | A1 | 5/2005 | Miller |
| 2005/0284826 | A1 | 12/2005 | Johnson |

*Primary Examiner*—Neil Abrams
*Assistant Examiner*—Phuong Nguyen
(74) *Attorney, Agent, or Firm*—Wei Te Chung; Andrew C. Cheng; Ming Chieh Chang

(57) ABSTRACT

An electric connector assembly includes a flexible printed circuit including a fastening potion and two different surfaces, an electric connector attached on the first surface of the FPC, a first reinforced patch, attached on the second surface of the FPC, a pulling element attached on the first reinforced patch and including a second reinforced patch and a pull-tab. The pull-tab surrounds the second reinforced patch therein and a part of the pull-tab is attached between the first and second reinforced patches.

16 Claims, 5 Drawing Sheets

BOARD-TO-BOARD CONNECTOR ASSEMBLY HAVING PULL TAB

BACKGROUND OF THE INVENTION

1. Field of the Invention

The present invention relates generally to an electric connector assembly, and more particularly to an electric connector assembly suitable for connecting a board to another board.

2. Description of the Prior Art

A board to board connector is used widely to connect two circuit boards which are parallel to each other. The board to board connector comprises a plug connected to a circuit board and a socket connected to the other circuit board. The plug is connected to the socket to joint the two circuit boards together with a distance between the two circuit boards.

At present, the circuit board is typically to be a Flexible Printed Circuit (FPC) and the board to board connector is typically to be a low-structure electric connector assembly. The FPC comprises a fastening area with some golden fingers to securely and electrically attach the low-structure electric connector assembly thereon. The electric connector assembly is connected to the golden fingers through Surface Mount Technology (SMT). For adapting to be received in small electric device, the dimension of the electric connector assembly has become smaller and smaller.) Thus, the electric connector assembly needs a Pull-tab assembled thereon to be pulled apart from the FPC easily.

Conventional electric connector assembly has abundant space to fix a pull-tab on the two sides of the housing of the electric connector. However, for the limited dimension of the board to board connector, the board to board connector is not suitable to fix a pull-tab by a method similar to which is used on the conventional electric connector assembly. Thus, the pull-tab has been pasted to a reinforced patch which is attached on the FPC firmly. Reference to FIG. 1, the FPC 11' comprises a reinforced patch 14' to make the board to board connector attached on the FPC firmly, and the pull-tab 15' is pasted to the reinforced patch 14'. The pull-tab 15' is made from PET material. However, the pull-tab 15' made from PET material tends to break away from the reinforced patch 14' easily.

Hence, in this art, an electric connector assembly to overcome the above-mentioned disadvantages of the prior art should be provided.

BRIEF SUMMARY OF THE INVENTION

A primary object, therefore, of the present invention is to provide an electric connector assembly with a pull-tab firmly attached on the printed circuit board.

In order to implement the above object, the electric connector assembly made in accordance with the present invention comprises a flexible printed circuit, an electric connector, a first reinforced patch and a pull-tab.

The flexible printed circuit comprises a fastening potion and two different surfaces. The electric connector attached on the first surface of the FPC. The first reinforced patch attached on the second surface of the FPC. The pulling element being attached on the first reinforced patch and comprising a second reinforced patch and a pull-tab.

The pull-tab surrounds the second reinforced patch therein and a part of the pull-tab is attached between the first and second reinforced patches.

Other objects, advantages and novel features of the invention will become more apparent from the following detailed description of a preferred embodiment when taken in conjunction with the accompanying drawings.

DETAILED DESCRIPTION OF THE INVENTION

Reference will now be made in detail to a preferred embodiment of the present invention.

Figure 1:
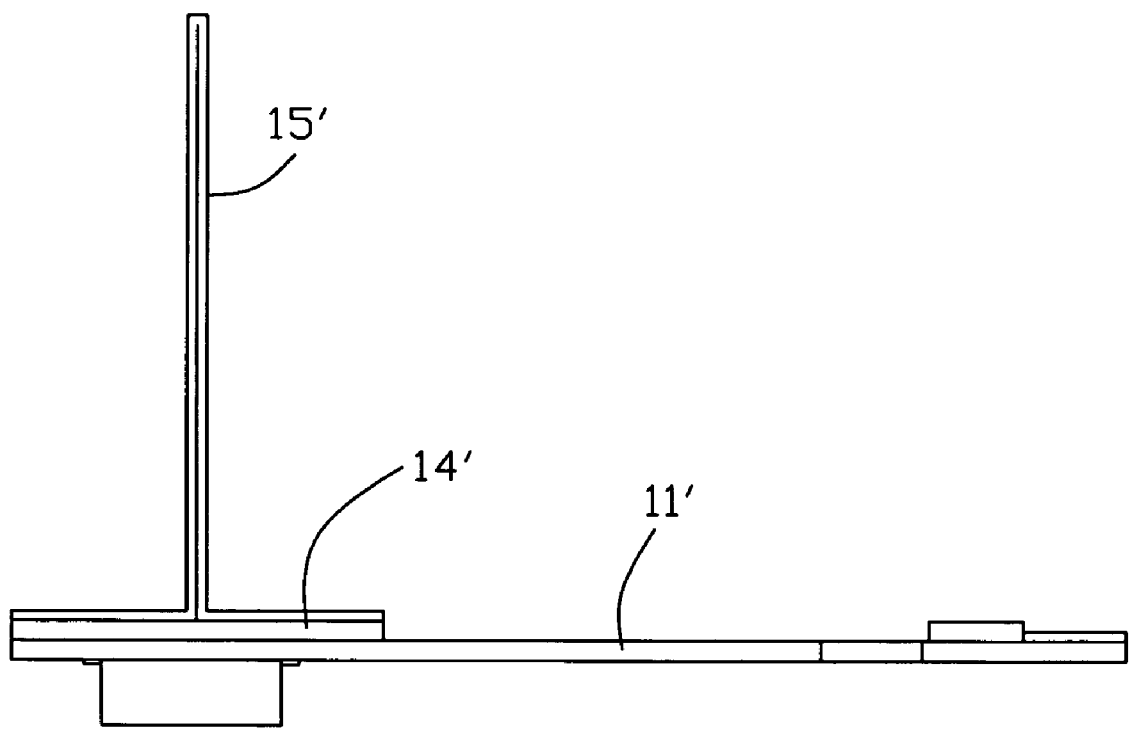
FIG. 1 is a side view of a conventional electric connector assembly with a pull-tab.
Figure 2:
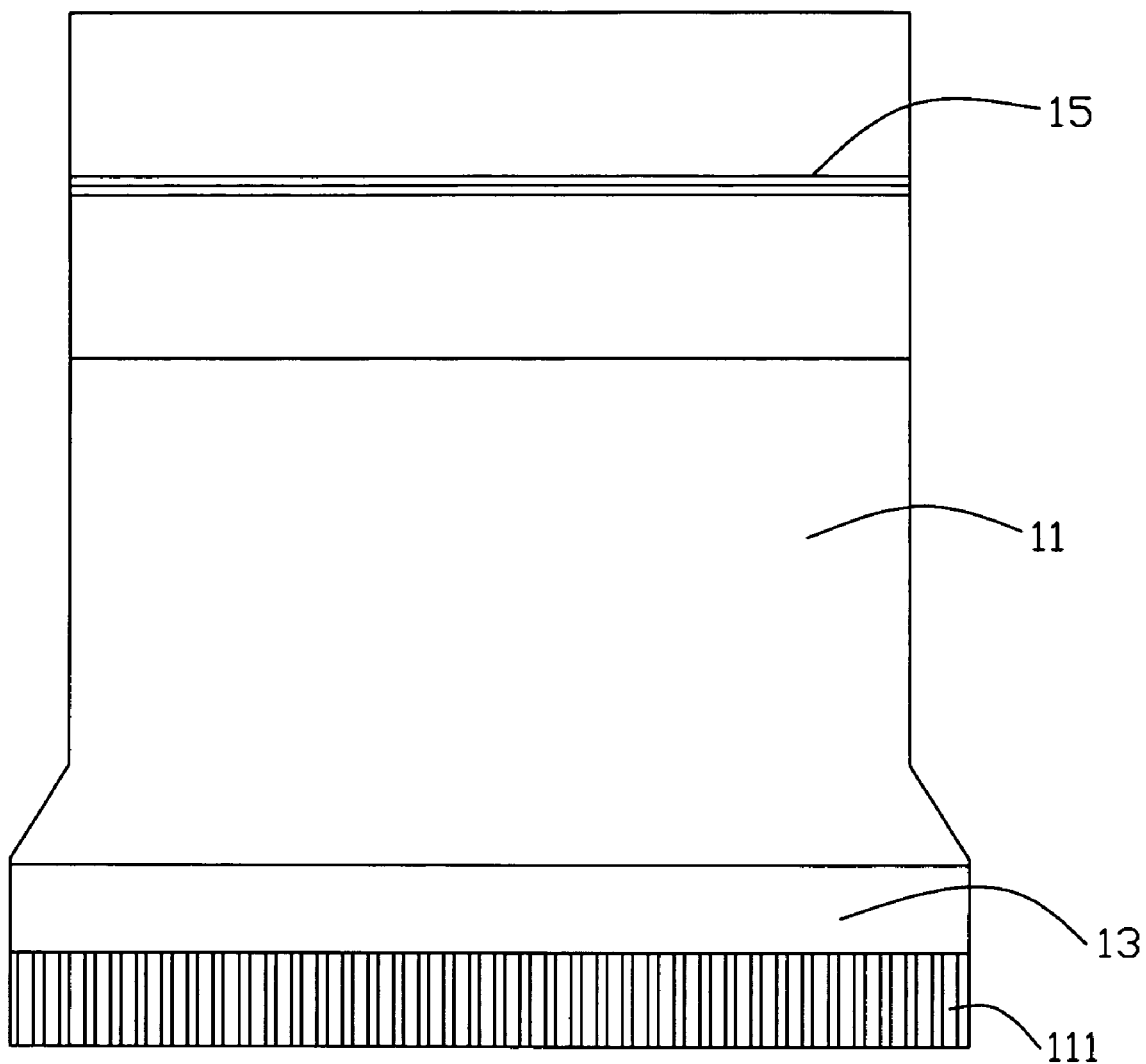
FIG. 2 is a top view illustrating a preferred embodiment of an electric connector assembly in according with the present invention.
Figure 3:
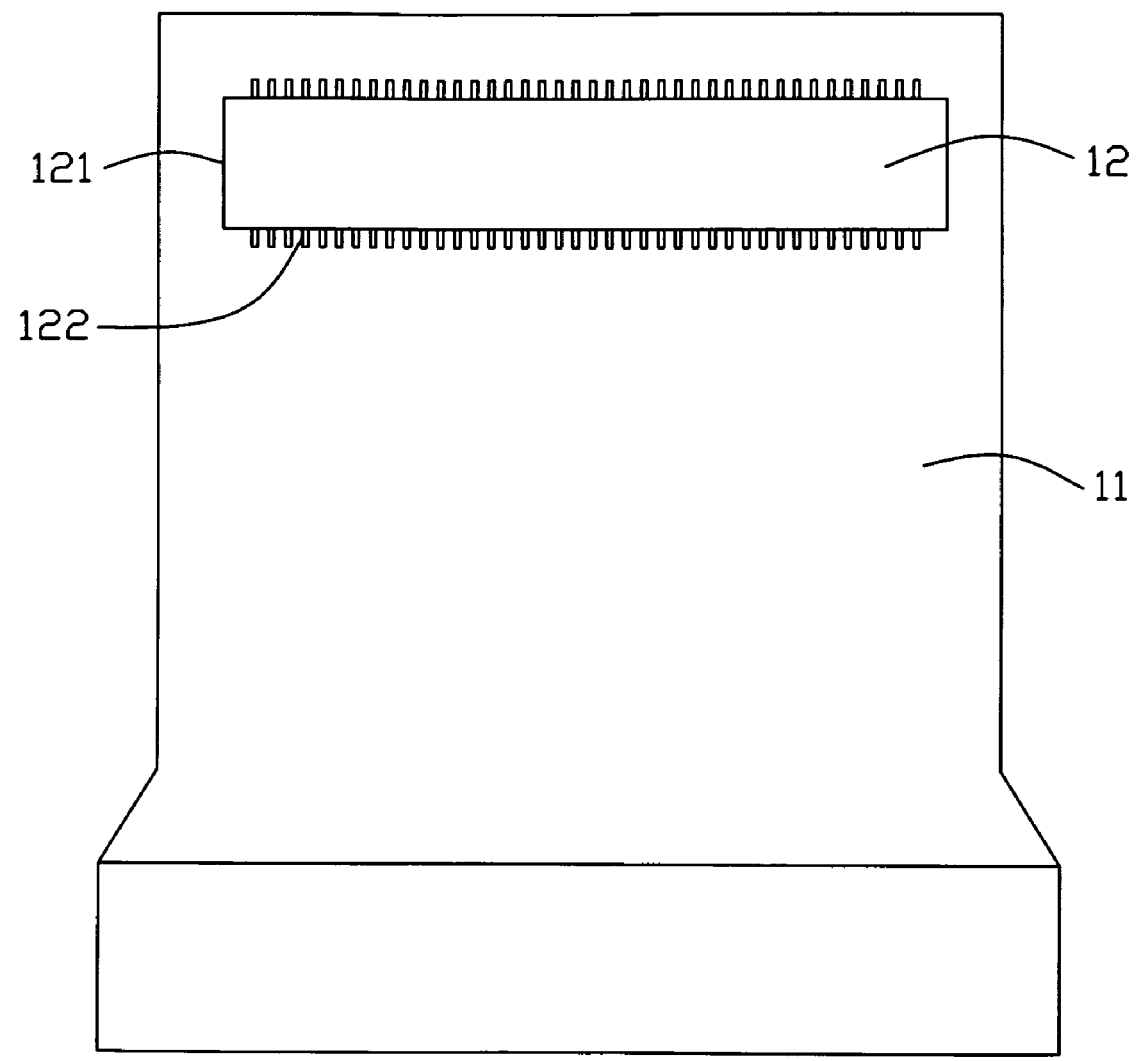
FIG. 3 is a bottom view illustrating the preferred embodiment of an electric connector assembly in according with the present invention.
Figure 4:
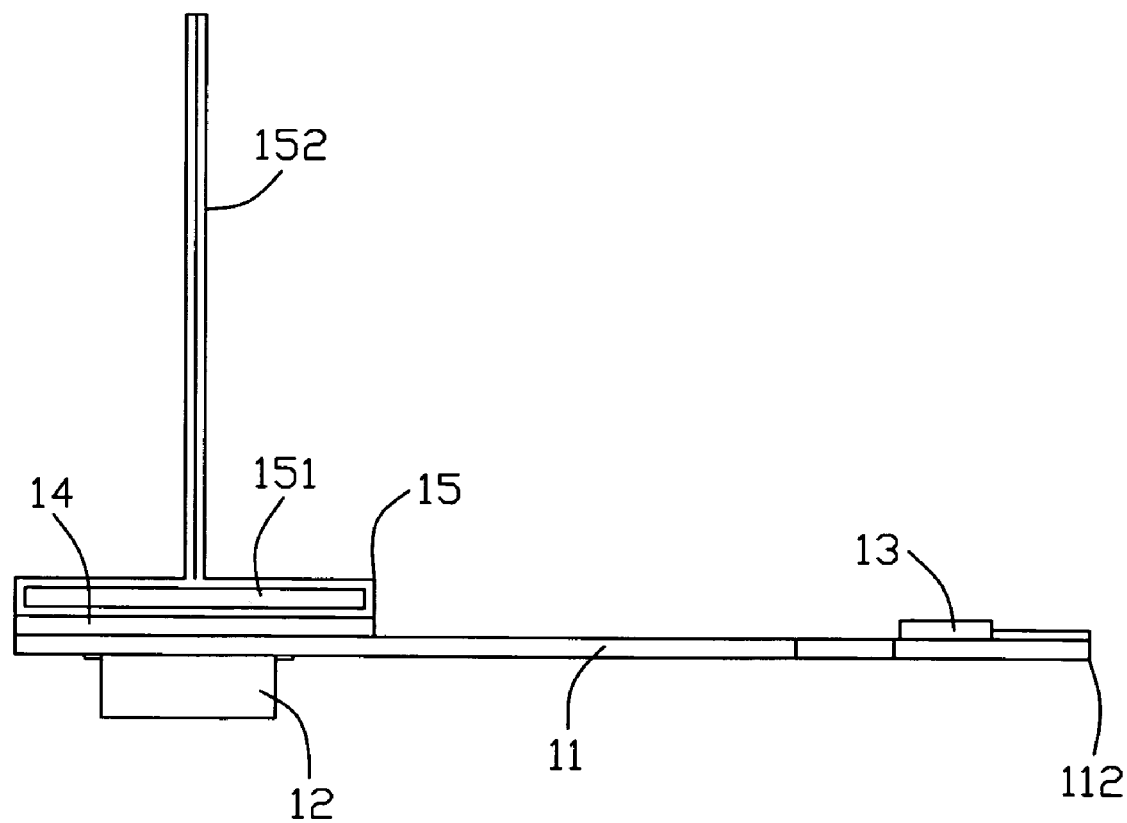
FIG. 4 is side view illustrating the preferred embodiment of an electric connector assembly in according with the present invention.

Reference to FIG. 2 to FIG. 4, an electric connector assembly in according with a first embodiment of the present invention is shown. The electric connector assembly 1 comprises a Flexible Printed Circuit 11, an electric connector 12, a first reinforced patch 14, a third reinforced patch 13, and a drawing element 15. The pulling element 15 comprises a second reinforced patch 151 and a pull-tab 152 surrounding the reinforced patch 151 therein. The reinforced patch 151 is of a rectangular configuration with a glutinous surface and made from plastic. The reinforced patch 151 is attached on the glutinous surface of the pull-tab 152 and the pull-tab 152 is surrounded over four of the six surfaces of the reinforced patch 151. The two ends of the pull-tab 152 are adhered to each other. The reinforced patch 151 and the pull-tab 152 form a T shape.

The FPC 11 comprises a group of golden fingers 111 in the front of the upper surface thereof. The golden fingers 111 are arranged in a line along the front end of the FPC 11. The third reinforced patch 13 is attached on the upper surface of the FPC 11 and adjacent to the golden fingers 111. The portion of the FPC 11, with the golden fingers 111 and the third reinforced patch 13, form a matching portion 112 to be inserted into the complementary connector.

Figure 5:
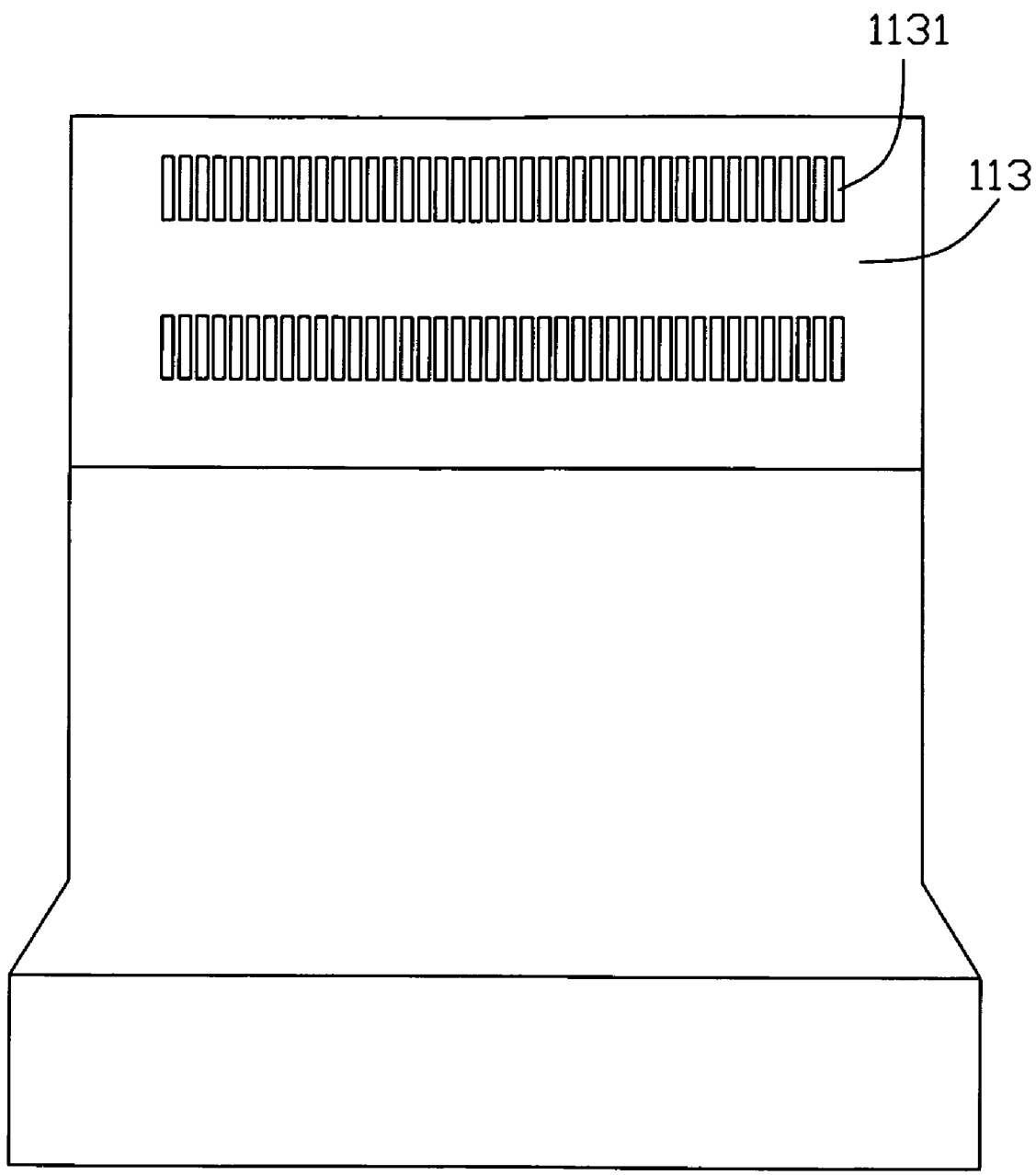
FIG. 5 is a top view illustrating the Flexible Printed Circuit of the preferred embodiment of an electric connector assembly in according with the present invention.

Reference to FIG. 5, the FPC 11 comprises a fastening portion 113 on the rear end thereof. The fastening portion 113 comprises two groups of bare metal pins 1131 on the lower surface thereof to arrange in two rows and the first reinforced patch 14 is located on the upper surface of the fastening portion 113. The pulling element 15 is attached on the upper surface of the first reinforced patch 14. In this embodiment, the first, third reinforced patches 14, 13 are respectively attached on the FPC 11 through adhesive, and the pulling element 15 is also attached on the first reinforced patch 14 through adhesive.

The electric connector 12 comprises an insulative housing 121 extending along a lengthwise direction and some conductor 122 received in the housing 121. The two groups of conductors 122 are arranged to form two rows and respectively corresponding to the metal pins 1131. The electric connector 12 is soldered on surface of the FPC 11 through Surface Mounted Technology companying one conductor 122 corresponding to one metal pin 1131.

The pulling element 15 has a hard bottom and a portion of the pulling element 15 is attached between the first and second reinforced patches 14, 151. Thus, the pulling element 15 is attached on the FPC 11 tightly.

What is claimed is:

1. An electric connector assembly, comprising:
   a flexible printed circuit, comprising a fastening potion and two different surfaces; an electric connector, attached on the first surface of the FPC; a first reinforced patch, attached on the second surface of the FPC; and
   a pulling element, attached on the first reinforced patch and comprising a second reinforced patch and a pull-tab;
   said pull-tab surrounding the second reinforced patch therein and a part of the pull-tab being attached between the first and second reinforced patches;
   wherein the pulling element, the first reinforced patch and the second reinforced patch are three separate pieces.

2. The electric connector assembly as claimed in claim 1, wherein said FPC comprises a group of golden fingers on the front thereof.

3. The electric connector assembly as claimed in claim 2, wherein said electric connector assembly further comprises a third reinforced patch, said third reinforced patch is attached on first surface of the FPC and adjacent to the golden fingers.

4. The electric connector assembly as claimed in claim 3, wherein said third reinforced patch, golden fingers and the front end of the FPC are form a mating portion.

5. The electric connector assembly as claimed in claim 1, wherein said FPC comprises two group of metal pins on the second surface thereof.

6. The electric connector assembly as claimed in claim 5, wherein said electric connector comprises an insulative housing extending along a lengthwise direction and two groups of conductors corresponding to the metal pins.

7. The electric connector assembly as claimed in claim 6, wherein said two groups of conductors are arranged in two rows.

8. The electric connector assembly as claimed in claim 7, wherein said electric connector is soldered on surface of the FPC through Surface Mounted Technology companying one conductor corresponding to one metal pin.

9. An electrical connector assembly comprising:
   a flexible printed circuit (FPC) board defining opposite first and second surfaces thereon; an electrical connector attached to the first surface;
   a first reinforcement plate being stiffer than the FPC board and attached upon the second surface and essentially aligned with the connector in a vertical direction perpendicular to said first and second surfaces;
   a pulling member located upon the first reinforcement plate and including a second reinforcement plate, which is stiffer than the FPC board, and a flexible pull tab; said pull tab defines a bottom end which fully intimately surrounds the second reinforcement plate; and a bottom portion of the pull tab is attached upon a bottom surface of the second reinforcement plate;
   wherein the pulling element, the first reinforcement plate and the second reinforcement plate are three separate pieces.

10. The electrical connector assembly as claimed in claim 9, wherein the bottom portion of the pull tab is sandwiched between the first reinforcement plate and said second reinforcement plate.

11. The electrical connector assembly as claimed in claim 9, wherein; said FPC comprises a group of golden fingers on the front thereof.

12. The electrical connector assembly as claimed in claim 9, wherein said first reinforcement plate is fully separate from the second reinforcement plate in said vertical direction by the bottom portion of the pull tab.

13. The electrical connector assembly as claimed in claim 9, wherein said pull tab is a single piece band in a folded manner with two opposite free ends attached to each other and located at an upper section of the pull tab during use.

14. The electrical connector assembly as claimed in claim 9, wherein said first reinforcement plate is horizontally larger than the connector.

15. An electrical connector assembly comprising:
   a flexible printed circuit (FPC) board defining opposite first and second surfaces thereon; an electrical connector attached to the first surface;
   a first reinforcement plate being stiffer than the FPC board and attached upon the second surface and essentially aligned with the connector in a vertical direction perpendicular to said first and second surfaces;
   a pulling member located upon the first reinforcement plate and including a flexible pull tab; wherein said pull tab is a single piece band in a folded manner with two opposite free ends attached to each other and located at a top section of the pull tab during use;
   said pull tab includes a bottom portion surrounding a second reinforcement plate and attached to the first reinforcement plate;
   wherein the pulling element, the first reinforcement plate and the second reinforcement plate are three separate pieces.

16. The electrical connector assembly as claimed in claim 15, wherein said second reinforcement plate is stiffer than the FPC board.

* * * * *